(12) United States Patent
Chittipeddi et al.

(10) Patent No.: US 6,417,087 B1
(45) Date of Patent: *Jul. 9, 2002

(54) PROCESS FOR FORMING A DUAL DAMASCENE BOND PAD STRUCTURE OVER ACTIVE CIRCUITRY

(75) Inventors: Sailesh Chittipeddi, Allentown, PA (US); William Thomas Cochran, Clermont, FL (US); Yehuda Smooha, Allentown, PA (US)

(73) Assignee: Agere Systems Guardian Corp., Miami Lakes, FL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/465,075

(22) Filed: Dec. 16, 1999

(51) Int. Cl.[7] ...................... H01L 21/44; H01L 21/4763
(52) U.S. Cl. .................. 438/612; 438/618; 438/622; 438/624; 438/627; 438/637; 438/638
(58) Field of Search ................. 438/612, 618, 438/620, 622, 626, 627, 631, 672, 675, 666, 611, 613, 614, 615, 616, 617, 624, 637, 638, 633

(56) References Cited

U.S. PATENT DOCUMENTS

| | | | | |
|---|---|---|---|---|
| 5,451,551 A | * | 9/1995 | Krishman et al. | 438/626 |
| 5,741,626 A | * | 4/1998 | Jain et al. | 430/314 |
| 5,751,065 A | | 5/1998 | Chittipeddi et al. | 257/758 |
| 5,932,487 A | * | 8/1999 | Lou et al. | 438/692 |
| 6,033,984 A | * | 3/2000 | Schnabel et al. | 438/638 |
| 6,054,383 A | * | 4/2000 | Suzuki et al. | 438/633 |
| 6,093,630 A | * | 7/2000 | Geffken et al. | 438/612 |
| 6,103,616 A | * | 8/2000 | Yu et al. | 438/622 |
| 6,144,099 A | * | 10/2000 | Lopatin et al. | 257/758 |
| 6,143,646 A | * | 11/2000 | Wetzel | 438/637 |
| 6,180,506 B1 | * | 1/2001 | Sullivan | 438/618 |

* cited by examiner

*Primary Examiner*—Charles Bowers
*Assistant Examiner*—Thanhha Pham
(74) *Attorney, Agent, or Firm*—Christie, Parker & Hale, LLP

(57) ABSTRACT

A process for forming a dual damascene bond pad within an integrated circuit produces a bond pad which is resistant to stress effects and which therefore allows for the bond pad to be formed over active circuitry. The process includes forming a dual damascene structure by forming a bond pad opening having a barrier layer film on the bottom surface of the upper portion of the opening, and forming vias which extend downwardly through the bottom surface. The process produces a bond pad which is resistant to stress effects such as cracking which can be produced when bonding an external wire to the bond pad. Leakage currents between the bond pad and the underlying circuitry are prevented.

20 Claims, 5 Drawing Sheets

PROCESS FOR FORMING A DUAL DAMASCENE BOND PAD STRUCTURE OVER ACTIVE CIRCUITRY

RELATED APPLICATION

This application is related to U.S. application Ser. No. 09/465,089 filed on Dec. 16.

FIELD OF THE INVENTION

This invention relates generally to the field of integrated circuits and particularly to such integrated circuits having at least a portion of the active circuitry positioned under the bond pads. More particularly, the invention relates to a process for forming such a bond pad.

BACKGROUND OF THE INVENTION

As today's advancing semiconductor processing technology allows for higher integration levels within integrated circuit devices, it becomes increasingly more important to fully utilize the space available within the substrates on which the integrated circuit devices are produced. An integrated circuit device is also known as a chip especially when it is still included within the semiconductor substrate on which it is formed. Chip size is determined, in large part, by the density and number of individual devices which combine to form a completed integrated circuit device. By minimizing or reducing chip size, more chips can be created within a substrate of a fixed dimension, and production costs are therefore decreased.

Each integrated circuit device includes a number of bond pads which are used to provide for electrical connection to external components. More specifically, the electrical connections between the external pins of an assembled integrated circuit package and the integrated circuit itself, are made through bond pads which are generally located on the periphery of the chip. Bond pads are metal areas which are electrically connected to the multitude of individual devices which combine to form the integrated circuit, via buffers and other electrically conducting interconnects. Due to conventional bonding technology used to couple external conductive wires to the bond pads, and also due to design constraints, the bond pads have relatively large dimensions when compared to other features such as transistors or other individual devices which combine to form the integrated circuit device. Therefore, bond pads occupy or cover a significant portion of the chip surface. The area underneath the bond pads thus occupies a substantial fraction of the surface of the substrate comprising the chip. Conventionally, the area used to form the bond pads, in a sense, came at the expense of area which could be used to form other devices of the integrated circuit. It can be therefore understood that providing active devices beneath the bond pads increases the level of integration of the integrated circuit device and may also allow for a reduced chip size.

The electrical connection between the package and the bond pad requires physical integrity as well as high electrical conductivity. The conventional bonding processes used to bond an external wire of the package to the bond pad of the integrated circuit, typically require either elevated temperatures, high pressures, or both, as well as ultrasonic energy. These effects are required to produce a connection between the bond pad and the external wire which is of high physical integrity and low electrical resistance. These conditions used for coupling the wire to the bond pad, however, can cause defects in a dielectric film over which the bond pad is typically formed.

Bond pads are conventionally formed over dielectric materials to electrically insulate the bond pad metal from the substrate and from other electrical devices which may be formed beneath the bond pads. The conditions of conventional methods used to couple external wires to bond pads, can produce mechanical stresses in the dielectric film formed beneath the bond pad. The stresses may cause defects which can result in leakage currents through the dielectric formed between the bond pads and the underlying substrate, which is frequently electrically conducting, and other devices if they are formed beneath the bond pads. As such, using conventional processing technology, these leakage currents preclude incorporating active devices beneath the bond pads. This limitation decreases the level of integration and the efficient use of substrate space for device purposes.

Attempts have been made to use the substrate area underneath the bond pads for active device purposes. Attempts have been made using conventional wire bonding technology. For example, U.S. Pat. No. 5,751,065 to Chittipeddi, et al. discloses providing an additional layer of metal beneath the dielectric formed beneath the bond pad, in order to minimize the effect of the stress of the bonding process, upon the substrate and the other devices formed beneath the bond pad. Metal is malleable and acts to absorb the stress. This technique using the additional metal layer, however, requires an additional sequence of process steps directed to depositing and patterning the metal film in order to produce the modified bond pad structure. These additional processing steps take time and add production and material costs to the production of an integrated circuit.

The present invention addresses the shortcomings of previous techniques, and provides a novel process for forming a bond pad structure which allows for the area beneath the bond pads to be utilized for active devices. The process does not require the formation of a separate metal film directed to accommodating the stresses produced using conventional wire bonding techniques.

SUMMARY OF THE INVENTION

The process of the present invention includes forming a dual damascene bond pad over active circuitry within an integrated circuit device. The process includes the steps of forming a bond pad opening, depositing a barrier layer film to form the bottom surface of an upper section of the bond pad opening, and forming vias which extend vertically through the bottom of the bond pad opening to form a dual damascene structure. The bond pad opening is then filled with a metal material. The vias may provide for connection between the bond pad metal and active circuitry formed beneath the bond pad. The bond pad formed according to the process of the present invention is resistant to stress effects such as leakage which may occur during wire bonding of the bond pad to an external wire.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1:
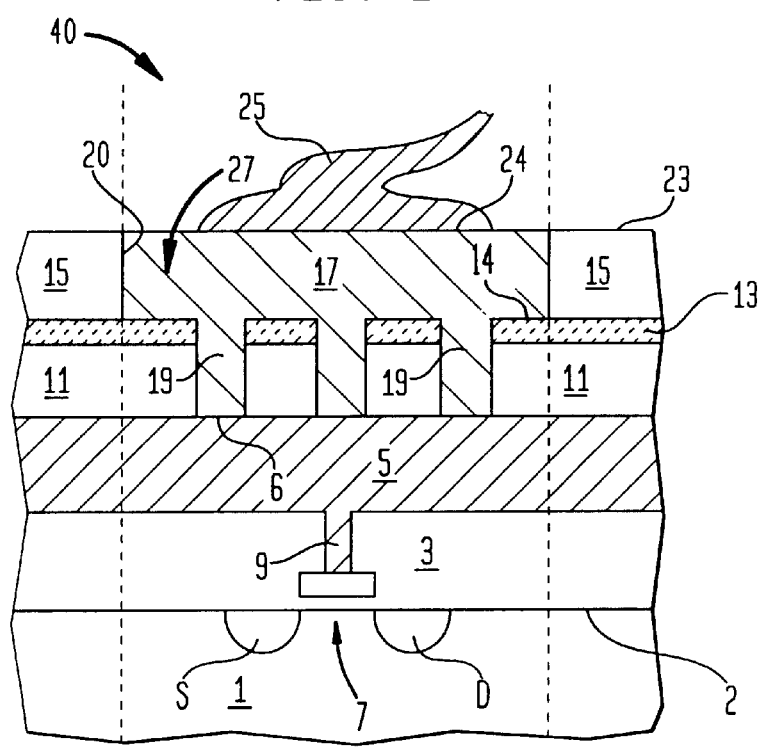
FIG. 1 is a cross-sectional view of an exemplary embodiment of the bond pad structure according to the present invention.

FIG. 1 is a cross-sectional view showing the bond pad structure of the present invention. Bond pad 27 is formed within bond pad region 40 formed over substrate 1. Within bond pad region 40 and beneath bond pad 27, active devices such as transistor 7 may be formed.

More particularly, FIG. 1 shows bond pad 27 formed within bond pad region 40 over substrate 1. Substrate 1 may be any suitable substrate on which semiconductor devices and integrated circuits are formed. In an exemplary embodiment, substrate 1 may be a silicon wafer. Bond pad 27 is formed of metal film 17. Metal film 17 may be any suitable metal film used as a conductive film within an integrated circuit. Examples of such conductive films include tungsten, aluminum, copper and their alloys such as AlCuSi. In other exemplary embodiments (not shown), metal film 17 may be a composite film including one of the metal films described above, and another film such as a barrier layer film.

Bond pad 27 includes lower surface 14 which is formed of a barrier layer film 13. In the embodiment shown in FIG. 1, barrier layer film 13 also extends peripherally beyond bond pad region 40. Top surface 24 of bond pad 27 is essentially coplanar with top surface 23 of upper dielectric film 15, within which bond pad opening 20 is formed. Beneath barrier layer 13 is lower dielectric film 11 which generally insulates bond pad 27 from conductive film 5 and other active devices which may be formed beneath the bond pad 27 and within bond pad region 40. In the exemplary embodiment, via holes 19 (hereinafter, "vias") provide direct electrical connection between bond pad 27 and conductive film 5. In various embodiments, conductive film 5 may be a metal film such as aluminum or copper which may be patterned, a polysilicon or other semiconductor film, or a patterned semiconductor film. In an exemplary embodiment, conductive film 5 may be a patterned metal alloy film such as AlCuSi or another aluminum or copper alloy.

Metal film 17 is included within opening 20 formed within upper dielectric film 15. Electrical connection is provided between bond pad 27 and conductive film 5 through vias 19 formed through barrier layer film 13 which forms the bottom surface 14 of the bond pad, and through lower dielectric film 11. Together, opening 20 and vias 19 form a dual damascene structure. In the exemplary embodiment shown in FIG. 1, conductive film 5 is further coupled, by means of contact 9 formed in insulating film 3, to transistor 7 formed on substrate 1 within bond pad region 40. In other exemplary embodiments, conductive film 5 may be additionally or alternatively connected laterally to other devices not included within bond pad region 40.

Although FIG. 1 shows vias 19 each directly extending to surface 6 of conductive film 5, it should be understood that, in embodiments where the conductive film is a patterned film, vias 19 may additionally or alternatively extend down to areas within bond pad region 40 where patterned conductive film 5 is not present.

Insulating film 3 generally insulates conductive film 5 from other devices formed on and within substrate 1 within bond pad region 40. It should be understood that, although transistor 7 is shown including source region S and drain region D formed within substrate 1 beneath bond pad 27 and within bond pad region 40, other active devices may be used. It is an advantage of the present invention that any of various active devices may be formed in or on substrate 1 within bond pad region 40 and beneath bond pad 27 because of the dual damascene structure of the bond pad and the presence of barrier layer film 13 forming the lower surface of the bond pad opening within bond pad region 40. It should be further understood that more than one active device may be included within the bond pad region 40.

The completed structure shown in FIG. 1 also includes conductive external wire 25 bonded to top surface 24 of bond pad 27. Because of the structure of the bond pad of the present invention, when external wire 25 is bonded to top surface 24 using conventional bonding methods which typically stress the underlying substrate, cracks are prevented from forming in underlying dielectric films such as lower dielectric film 11. As such, the effects of the stress associated with the bonding process, are reduced. Leakage through the underlying dielectric film is suppressed, allowing for active devices such as transistor 7 to be included beneath bond pad 27 within bond pad region 40.

Figure 2:
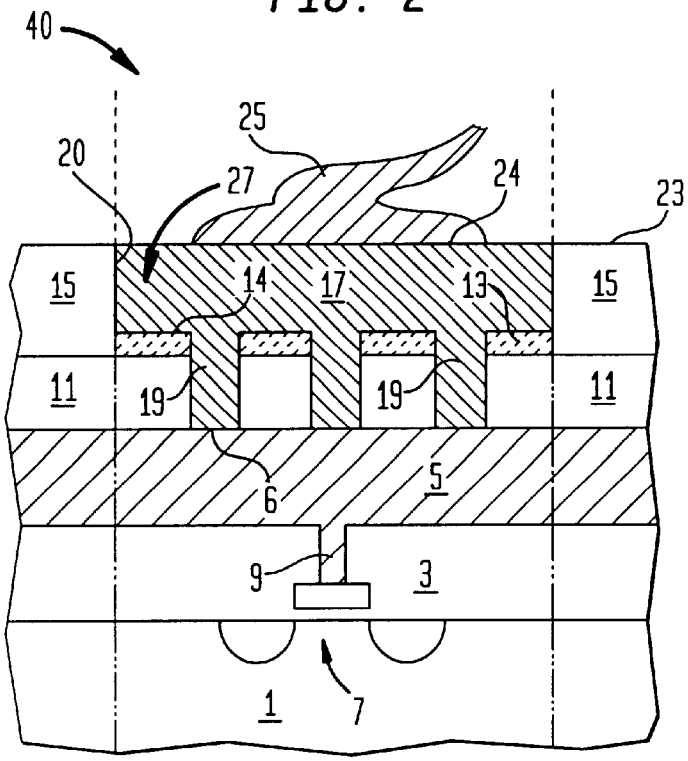
FIG. 2 is a cross-sectional view of another exemplary embodiment of the bond pad structure according to the present invention.

FIG. 2 shows another exemplary embodiment of the bond pad structure according to the present invention. The structure shown in FIG. 2 is substantially the same as the bond pad structure shown in FIG. 1, with the exception being that, in FIG. 2, barrier layer film 13 does not extend peripherally beyond bond pad region 40. The presence of barrier layer film 13 within bond pad region 40 and the dual damascene structure of bond pad 27 including vias 19, suffices to suppress stress related defects in the underlying films during the bonding process by which external conductive wire 25 is bonded to top surface 24 of bond pad 27. Other features of FIG. 2 are identical to the features in FIG. 1 and are as described in conjunction with FIG. 1.

Figure 3:
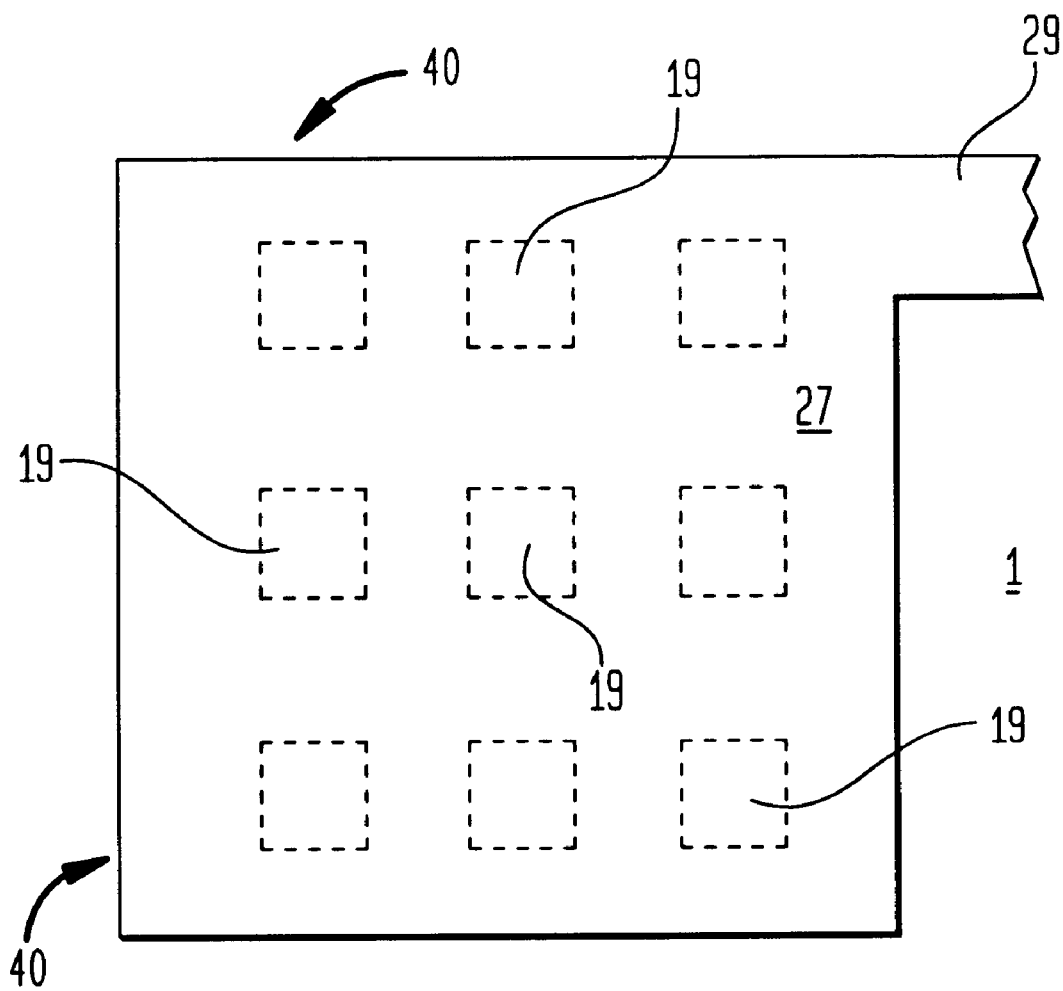
FIG. 3 is a plan view of a bond pad according to the present invention.

FIG. 3 is a plan view which represents a top view of each of the cross-sectional structures shown in FIGS. 1 and 2. As such, dashed lines 19 represent vias shown in FIGS. 1 and 2 which extend down from the bond pad and which may provide connection to features formed beneath the bond pad and within bond pad region 40. Lead line 29 provides electrical connection to other features formed on or within substrate 1. It should be understood that the configuration of bond pad 27 is not intended to be limited to the square structure shown in FIG. 3. Rather, bond pad 27 may take on various shapes. For example, the shape of bond pad 27 may be rectangular, trapezoidal, or rounded. Furthermore, the bond pad structure of the present invention is not intended to be limited to the number and arrangement of vias 19 shown in FIG. 3. The nine vias shown in FIG. 3 are intended to be exemplary only. In various embodiments, the dual damascene bond pad structure formed according to the present invention may include any number of via openings 19, including a single via within bond pad region 40.

With respect to each of FIGS. 1, 2 and 3, it should be stressed that various features have been expanded or reduced for clarity. The relative dimensions of the features shown in FIGS. 1–3, are not intended to accurately represent the actual relative dimensions of the features in the physical embodiment; rather, they are primarily illustrative. For example, the thickness of each of the films shown has been increased with respect to the lateral dimension of the bond pad structure, in order to illustrate the relative arrangement of the films.

Figure 4A:
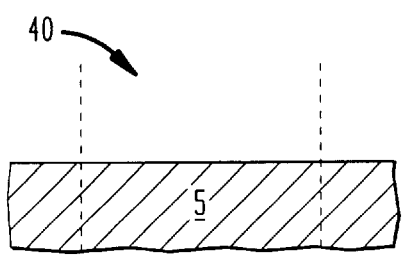
FIGS. 4A–4M are cross-sectional views of the various sequences of process operations used to form exemplary embodiments of the present invention.

Now turning to FIGS. 4A–4M, another aspect of the present invention is shown. FIGS. 4A–4M show the sequence of process operations used to form various exemplary embodiments of the bond pad structure. FIG. 4A is a cross-sectional view showing conductive film 5, over which the bond pad structure of the present invention will be formed. As shown in FIGS. 1 and 2, conductive film 5 is formed within the bond pad region and over a substrate which includes active devices formed beneath conductive film 5 within the bond pad region. For purposes of clarity, the substructure beneath conductive film 5 is not shown in FIGS. 4A–4M, but it should be understood that bond pad region 40 includes active devices formed on or within the substrate and beneath the bond pad. The substrate and active devices (not shown) beneath conductive film 5 are as described in conjunction with FIG. 1. In an exemplary embodiment, conductive film 5 may be a metal film such as tungsten, aluminum, copper, an aluminum alloy, or a copper alloy, or it may be a semiconductor film such as polysilicon or the like. Conductive film 5 may be a patterned film, and in an exemplary embodiment will be patterned within the region (bond pad region 40) above which the bond pad will be formed.

Figure 4B:
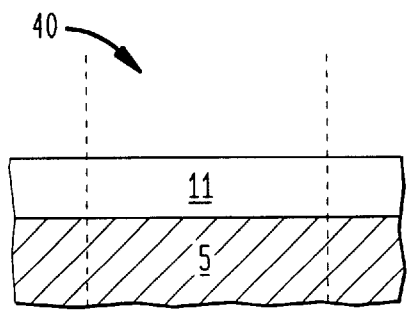
Figure 4C:
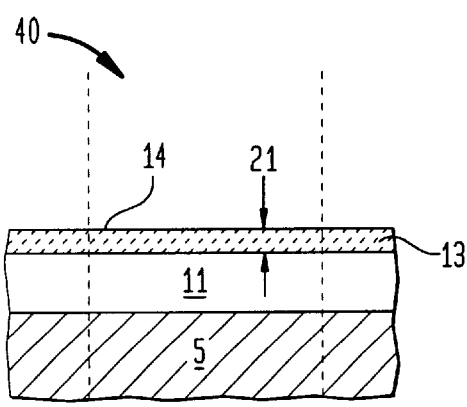

Now turning to FIG. 4B, lower dielectric film 11 is shown, and bond pad region 40 is defined. Lower dielectric film 11 may be an oxide, oxynitride, or other insulating film, and may be formed by conventional methods such as chemical vapor deposition (CVD). FIG. 4C shows barrier layer film 13 formed over lower dielectric film 11 and bond pad region 40 which is aligned over actual devices (not shown) formed on or within the substrate as described above. Barrier layer film 13 may be formed by conventional methods such as CVD, sputtering or evaporation. Barrier layer film 13 includes top surface 14 which will ultimately form the lower surface of a bond pad opening which will be formed in a subsequently deposited, superjacent dielectric film. Barrier layer film 13 is shown as formed within bond pad region 40 which is aligned with active devices, and also extending laterally beyond bond pad region 40. In another exemplary embodiment, barrier layer film may be patterned using conventional methods and will remain only within bond pad region 40. In various exemplary embodiments, barrier layer film 13 may be a film formed of tantalum (Ta), tantalum silicide (TaSi), tantalum nitride (TaN), titanium (Ti), titanium silicide (TiSi), titanium nitride (TiN), tungsten silicide (WSi), or tungsten silicide nitride (WSiN). In another exemplary embodiment, barrier layer film 13 may represent a composite film formed using any of the above barrier layer films in combination. Thickness 21 of barrier layer film 13 may be any suitable thickness as determined by device requirements, but will preferably be within the range of 500 to 2000 angstroms.

Figure 4D:
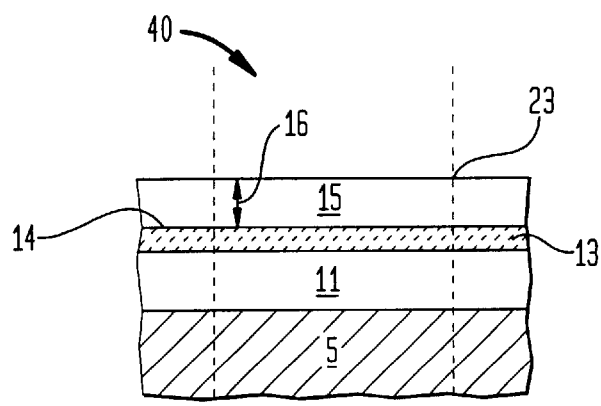

Now turning to FIG. 4D, upper dielectric film 15 is formed over top surface 14 of barrier layer film 13. Upper dielectric film 15 may be an oxide, oxynitride, or other insulating film, and may be the same or a different film than lower dielectric film 11. Thickness 16 of upper dielectric film 15 may be any suitable thickness as determined by device requirements. In various exemplary embodiments, thickness 16 may range from 200 to 20,000 angstroms. Upper dielectric film 15 includes top surface 23, and may be formed using conventional methods such as CVD or plasma enhanced-CVD.

Figure 4E:
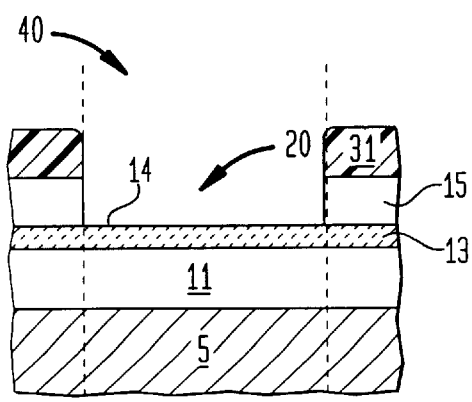

FIG. 4E shows bond pad opening 20 formed within bond pad region 40 by removing the portions of upper dielectric film 15 which are in bond pad region 40. This is accomplished by forming a masking pattern within a masking film 31 formed over top surface 23 of upper dielectric film 15. Conventional processing techniques, such as by coating a photosensitive masking film 31 such as photoresist, over top surface 23, then subsequently patterning the film using conventional methods, may be used. After a pattern is formed in masking film 31, opening 20 is then formed by etching methods. Wet, chemical etching methods may be used, or dry, RIE (reactive ion etching) plasma etching methods may be employed. Any suitable etching procedure which selectively removes upper dielectric film 15 from bond pad region 40, and which does not significantly attack barrier layer film 13, may be used. As can be seen, in bond pad region 40, the entire thickness 16 of upper dielectric film 15 is removed by etching, producing opening 20 which includes lower surface 14 which is also the top surface of barrier layer film 13. It should be further understood that within bond pad region 40 and beneath conductive film 5, at least one active device is formed (as shown in FIGS. 1 and 2). After opening 20 is formed, masking film 31 may be removed by conventional methods.

Figure 4F:
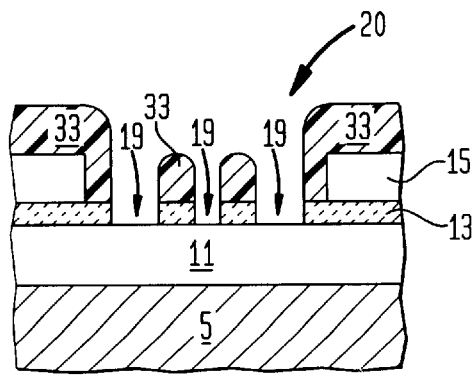

FIG. 4F shows the subsequent patterning step used in the dual damascene processing sequence. In FIG. 4F, masking film 33 is formed and patterned using conventional methods. In an exemplary embodiment, masking film 33 may be a photosensitive film similar or identical to the photosensitive film 31 shown in FIG. 4E. A pattern is formed which includes vias 19 which may provide for electrical contact between the metal bond pad to be formed within bond pad opening 20 (as will be shown in FIG. 4H) and conductive film 5. After a pattern is formed, RIE or plasma etching techniques will be used to remove portions of barrier layer film 13 which are not covered by masking film 33.

Figure 4G:
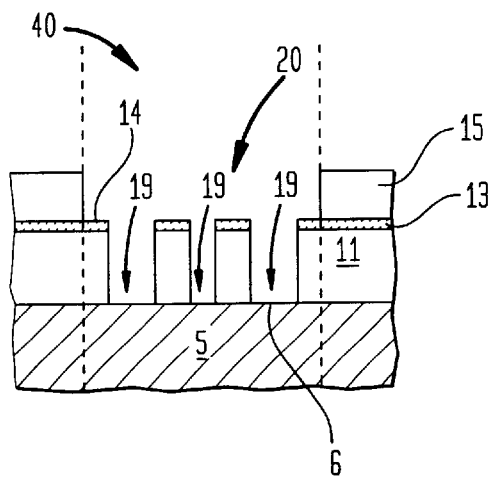

After the removal of barrier layer film 13 is complete, a subsequent etching process is used to remove portions of the lower dielectric film 11 in via 19 regions where the barrier layer film 13 has been removed. Conventional reactive ion etching processes may be used to selectively remove dielectric film 11 but which do not significantly attack conductive film 5. FIG. 4G shows via openings 19 extending from bond pad opening 20 to exposed surface 6 of underlying conductive film 5. After the vias 19 have been formed by etching through the entire thickness of barrier layer film 13 and lower dielectric film 11, masking film 33 may be removed using conventional methods. It should be understood that, in various exemplary embodiments, conductive film 5 may be a patterned film. As such, vias 19 may extend down to surface 6 of the patterned conductive film 5 thereby exposing a region of patterned conductive film 5, or the vias may alternatively extend down to other features within bond pad region 40, in areas where patterned conductive film 5 is not present. It should be further understood that any number of vias may be formed through the bottom of bond pad opening 20, according to various exemplary embodiments.

In another exemplary processing sequence (not shown), the order of some of the patterning and etching process operations may be reversed. According to a second exemplary embodiment, after the completed film structure is formed as shown in FIG. 4D prior to etching, the via or vias are first formed within the bond pad region. Via openings are formed by patterning a first masking film to produce a pattern similar to that of masking film 33 as shown in FIG. 4F, then etching through the entire thickness of the upper dielectric, and barrier layer films. After the first masking film is removed, another pattern is formed using a second masking film and exposing the entire bond pad region, which is then etched to remove the entire thickness of the upper dielectric film from the bond pad region. This dielectric etch simultaneously etches the via openings down to the upper surface of the underlying conductive film, producing the vias and the structure shown in FIG. 4G after the second masking film is removed. Although a different process sequence is used according to this second exemplary embodiment, the resulting structure as shown in FIG. 4G, is the same.

Figure 4H:
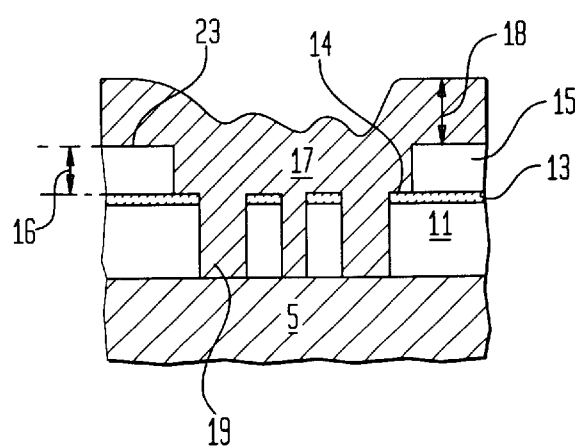
Figure 4I:
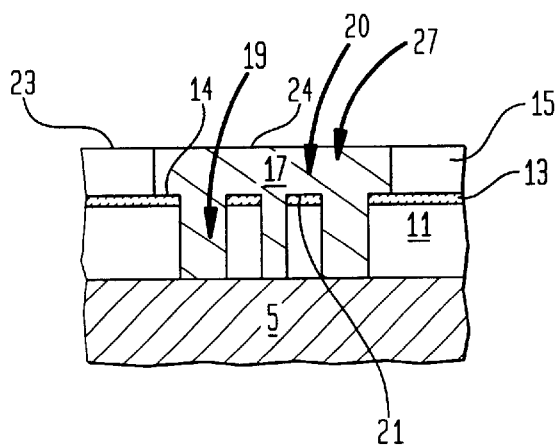

FIG. 4H shows metal film 17 formed within bond pad opening 20 and within vias 19 thereby providing electrical contact from bond pad 27 to underlying features such as conductive film 5. Metal film 17 may be a tungsten film, a copper film, an aluminum film, alloys such as an aluminum silicon film or an aluminum copper silicon film, or other suitable metal films. Bond pad metal film 17 may be formed by sputter deposition, evaporation, chemical vapor deposition or other means. Upon deposition, metal film 17 is a continuous film including portions formed above top surface 23 of upper dielectric film 15. In one exemplary embodiment, the thickness 18 of metal film 17 is chosen to be greater than the depth of the bond pad opening 20 (thickness 16 of upper dielectric film 15 as shown in FIG. 4D) to insure that bond pad opening 20 is completely filled with metal film 17. Thickness 18 of metal film 17 may vary according to the thickness of upper dielectric film 15, but may be as great as 2 microns. After the deposition of the film, polishing methods such as chemical mechanical polishing (CMP) may be used to remove portions of metal film 17 which lie above top surface 23, thereby producing the bond pad structure shown in FIG. 4I. It can be seen that top surface 23 and upper surface 24 of bond pad 27, form a smooth continuous surface and are substantially coplanar. Top surface 23 of bond pad 27 may be subsequently bonded to an external conductive wire, as shown in FIG. 1.

Figure 4J:
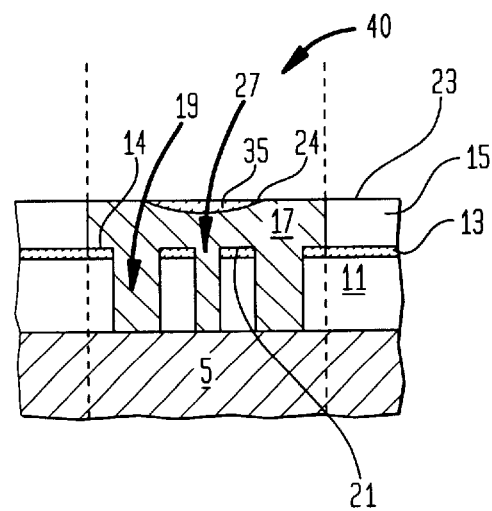

FIG. 4J shows another exemplary embodiment of the bond pad of the present invention. The bond pad shown in FIG. 4J includes upper barrier film 35. Upper barrier film 35 is added to the structure in the following manner. Instead of depositing metal film 17 having a thickness sufficient to completely fill bond pad opening 20 (as used to form the structure shown in FIG. 4H), the deposition of metal film 17 is stopped before metal film 17 completely fills bond pad opening 20. At this point, upper barrier layer film 35 is formed over the top surface of bond pad metal film 17, including a portion within bond pad opening 20. Upper barrier layer film 35 may include any of the films listed in conjunction with barrier layer film 13 and may have a thickness as great as 1000 angstroms. Upper barrier layer film 35 may be formed using sputtering techniques, or chemical vapor deposition or other deposition processes. After upper barrier layer film 35 is formed over bond pad metal film 17 and within bond pad region 20, a polishing technique such as CMP is used to remove portions of both bond pad metal film 17 and upper barrier film 35 which lie above top surface 23 of upper dielectric film 15.

It should be understood that the bond pad of the exemplary embodiment shown in FIG. 4J, will also include active devices formed beneath the bond pad. This feature is shown in the completed bond pad structures shown in the exemplary embodiments of FIGS. 1 and 2. Furthermore, this exemplary embodiment may alternatively include barrier layer film 13 being removed from regions outside bond pad region 40. It should be further understood that the exemplary embodiment shown in FIG. 4J, may also be bonded to an external conductive wire as shown in each of FIGS. 1 and 2.

Figure 4K:
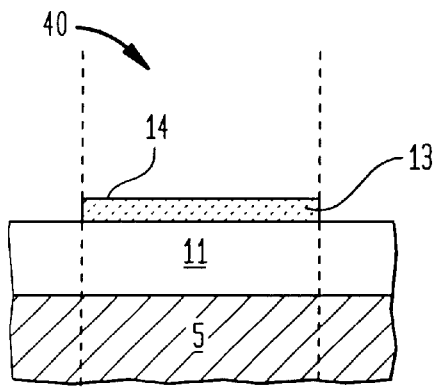

According to another exemplary embodiment of the process of the present invention, the sequence of process operations may be tailored to form the structure shown in FIG. 2. The bond pad structure shown in FIG. 2, differs from the bond pad structure shown in FIG. 1 in that barrier layer film 13 does not extend laterally beyond bond pad region 40 in FIG. 2. The sequence of process operations used to form this exemplary embodiment may include forming barrier layer film 13 over lower dielectric film 11, then patterning the barrier layer film 13 prior to forming an upper dielectric film, as shown in FIG. 4K. Both the lower dielectric film 11 and barrier layer film 13 as described in conjunction with FIGS. 4B–4C. Conventional patterning methods may be used to pattern the barrier layer film and to remove portions of the barrier layer film which extend laterally beyond bond pad region 40.

Figure 4L:
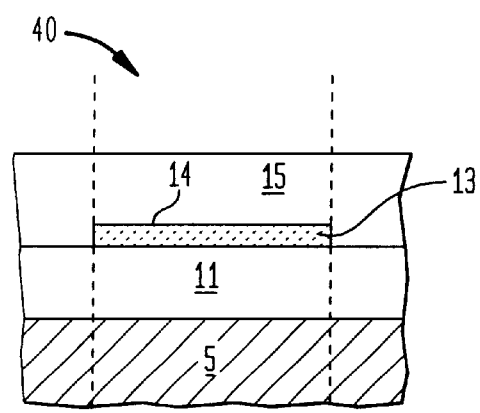

Now turning to FIG. 4L, upper dielectric film 15 is formed over the patterned barrier layer film 13. Upper dielectric film 15 is as described in conjunction with FIG. 4D. Next, bond pad opening 20 is formed within upper dielectric film 15 and which exposes barrier layer film 13. Bond pad opening 20 is formed as described in conjunction with FIG. 4E, and vias 19 are formed as described in conjunction with FIGS. 4F and 4G.

Figure 4M:
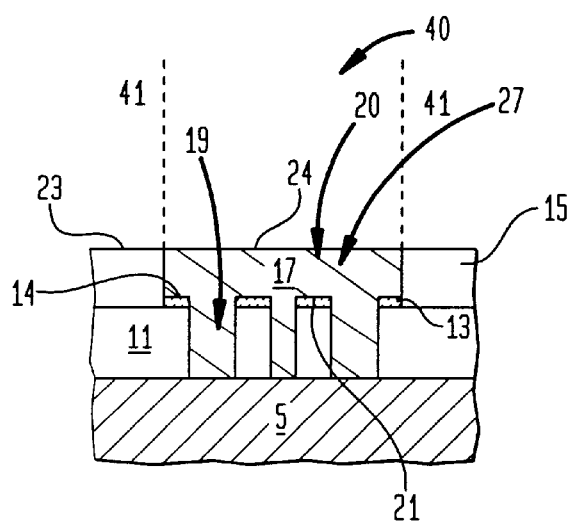

FIG. 4M shows barrier layer film 13 forming the bottom surface 14 of bond pad opening 20 within bond pad region 40. The bond pad is filled with metal film 17, which is formed as described in conjunction with FIGS. 4H and 4I. It can be seen that barrier layer film 13 is distinguished from the barrier layer film shown in FIGS. 4E–4J in that barrier layer film 13 shown in FIG. 4M, does not extend beneath upper dielectric film 15 into regions 41 which are regions outside of bond pad region 40. The structure shown in FIG. 4M is identical to the upper portion of the bond pad structure shown and described in FIG. 2.

While the invention is shown and described in conjunction with a single bond pad, it should be understood that the process and structure encompass a plurality of bond pads formed simultaneously within a plurality of integrated circuit devices formed on a substrate. The invention is not intended to be limited to a particular structure beneath the bond pads; rather, the present invention covers bond pads formed within a bond pad opening having a barrier layer film as a bottom surface, with any number of vias extending vertically beneath the bottom surface within the bond pad region. Beneath the bond pad may be a conductive film which may be patterned, and any number of different active devices within the bond pad area. The vias may provide electrical connection to the conductive film or other subjacent active devices. The conductive film beneath the bond pad may be coupled to active devices within or external to the bond pad region. The individual bond pads which combine to form an individual integrated circuit device, may also vary from one another in structure.

The preceding merely illustrates the principals of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principals of the invention and the concepts contributed by the inventors to furthering the art, and are to be construed as being without limitation to such specifically recited examples and conditions. More over, all statements herein reciting principals, aspects, and embodiments of the invention, as well as specific examples thereof, are intended to encompass both structural and functional equivalents thereof. Additionally, it is intended that such equivalents include both currently known equivalents such as equivalents developed in the future, i.e., any elements developed that perform the same function, regardless of structure. The scope of the present invention, therefore, is not intended to be limited to the exemplary embodiments shown and described herein. Rather, the scope and spirit of the present invention is embodied by the appended claims.

What is claimed:

1. A process for forming a bond pad within a semiconductor device comprising the steps of:
   a) providing a semiconductor substrate including a plurality of active devices formed thereon;
   b) forming a lower dielectric film over the semiconductor substrate including over the plurality of active devices;
   c) aligning a bond pad region over at least one of the plurality of active devices;
   d) forming a barrier layer over the lower dielectric film in at least the bond pad region;
   e) forming an upper dielectric film over the barrier layer and the lower dielectric film;
   f) removing the upper dielectric film from the bond pad region, thereby exposing the barrier layer and forming a bond pad opening;
   g) forming a plurality of vias within the bond pad region, each via extending through the barrier layer and through the lower dielectric film; and
   h) substantially filling each of the plurality of vias and the bond pad opening with a continuous metal film.

2. The process as in claim 1, in which step h) includes depositing the continuous metal film comprising at least one of copper and aluminum within each of the plurality of vias and the bond pad opening.

3. The process as in claim 1, in which step g) includes reactive ion etching.

4. The process as in claim 1, in which step f) includes selectively etching the upper dielectric film.

5. The process as in claim 1, in which step d) includes depositing a TiN film onto the lower dielectric film.

6. The process as in claim 1, in which step h) includes depositing the continuous metal film within each of the plurality of vias and the bond pad opening and over a top surface of the upper dielectric film, then removing portions of the deposited continuous metal film from over the top surface of the upper dielectric film.

7. The process as in claim 6, wherein the portions of the deposited continuous metal film are removed from over the top surface by chemical mechanical polishing.

8. The process as in claim 7, wherein the continuous metal film is a composite film including a further barrier layer formed over a bond pad metal film.

9. The process as in claim 1, further comprising step a1) forming a conductive film over the semiconductor substrate within the bond pad region, and wherein step b) includes forming the lower dielectric film over the conductive film.

10. The process as in claim 1, further comprising step a1) forming a patterned conductive film over the semiconductor substrate at least within the bond pad region, and wherein step b) includes forming the lower dielectric film over the patterned conductive film, and at least one via within the bond pad region exposes a region of the patterned conductive film.

11. The process as in claim 1, in which step d) includes depositing the barrier layer formed of a material selected from the group consisting of Ta, Ti, TaN, TiN, TaSi, TiSi, WSi and WSiN.

12. A process for forming a bond pad within a semiconductor device comprising the steps of:
   a) providing a semiconductor substrate including a plurality of active devices formed thereon;
   b) forming a lower dielectric film over the semiconductor substrate including over the plurality of active devices;
   c) aligning a bond pad region over at least one of the plurality of active devices;
   d) forming a barrier layer over the lower dielectric film in at least the bond pad region;
   e) forming an upper dielectric film over the barrier layer and the lower dielectric film;
   f) forming a plurality of vias within the bond region, each via extending through the upper dielectric film and the barrier layer;
   g) removing the upper dielectric film from the bond pad region by etching, thereby forming a bond pad opening, exposing the barrier layer throughout the bond pad region, and vertically extending each of the vias through the lower dielectric film; and
   h) substantially filling each of the vias and the bond pad opening with a continuous metal film.

13. The process as in claim 12, in which step h) includes depositing the continuous metal film comprising at least one of copper and aluminum within each of the vias and the bond pad opening.

14. The process as in claim 12, in which step h) includes depositing the continuous metal film within each of the vias and the bond pad opening and over a top surface of the upper dielectric film, then removing a portion of the deposited continuous metal film from over the top surface of the upper dielectric film.

15. The process as in claim 14, wherein the continuous metal film is a composite film including a further barrier layer formed over a bond pad metal film.

16. The process as in claim 12, further comprising step a1) forming a conductive film over the semiconductor substrate within the bond pad region, and wherein step b) comprises forming the lower dielectric film over the conductive film.

17. The process as in claim 12, in which step d) includes depositing a TiN film onto the lower dielectric film in the bond pad region and in areas outside the bond pad region.

18. The process as in claim 17 further comprising step d1) patterning the TiN film by removing portions of the TiN film which are outside the bond pad region.

19. A process for forming a bond pad within a semiconductor device comprising the steps of:
   a) providing a semiconductor substrate including a plurality of active devices, formed thereon;
   b) forming a patterned conductive film over the semiconductor substrate including over the plurality of active devices;
   c) forming a lower dielectric film over the patterned conductive film;
   d) aligning a bond pad region over at least one of the plurality of active devices;
   e) forming a barrier layer over the lower dielectric film in at least the bond pad region;
   f) forming an upper dielectric film over the barrier layer and the lower dielectric film;

g) removing the upper dielectric film from the bond pad region, thereby exposing the barrier layer and forming a bond pad opening;

h) forming a plurality of vias in the bond pad region, the vias extending through the barrier layer and through the lower dielectric film and exposing sections of the patterned conductive film;

i) depositing a single and continuous metal film within the vias and over the barrier layer in the bond pad region, partially filling the bond pad opening, and over a top surface of the upper dielectric film;

j) depositing a further barrier layer over the metal film, thereby filling the bond pad opening; and k) removing portions of the single and continuous metal film and the further barrier layer from over the top surface of the upper dielectric film.

20. The process as in claim 19, wherein step k) comprising removing the portions of the single and continuous metal film and the further barrier layer by chemical mechanical polishing.

* * * * *